(12) United States Patent
Chang et al.

(10) Patent No.: US 12,557,568 B2
(45) Date of Patent: Feb. 17, 2026

(54) CONDUCTIVE FEATURE FORMATION AND STRUCTURE

(71) Applicant: Taiwan Semiconductor Manufacturing Co., Ltd., Hsinchu (TW)

(72) Inventors: Cheng-Wei Chang, Taipei (TW); Min-Hsiu Hung, Tainan (TW); Hung-Yi Huang, Hsinchu (TW); Chun Chieh Wang, Kaohsiung (TW); Yu-Ting Lin, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 40 days.

(21) Appl. No.: 18/771,110

(22) Filed: Jul. 12, 2024

(65) Prior Publication Data
US 2024/0363339 A1    Oct. 31, 2024

Related U.S. Application Data

(60) Continuation of application No. 17/577,726, filed on Jan. 18, 2022, now Pat. No. 12,087,575, which is a
(Continued)

(51) Int. Cl.
*H01L 21/02* (2006.01)
*H01L 21/285* (2006.01)
(Continued)

(52) U.S. Cl.
CPC .. *H01L 21/02274* (2013.01); *H01L 21/28518* (2013.01); *H01L 21/762* (2013.01);
(Continued)

(58) Field of Classification Search
None
See application file for complete search history.

(56) References Cited

U.S. PATENT DOCUMENTS

| 5,393,565 A | * | 2/1995 | Suzuki | H01L 21/76855 438/653 |
| 5,831,335 A | * | 11/1998 | Miyamoto | H10D 64/259 257/757 |

(Continued)

FOREIGN PATENT DOCUMENTS

| CN | 1553495 A | 12/2004 |
| CN | 101397653 A | 4/2009 |

(Continued)

OTHER PUBLICATIONS

Tuung Luoh et al., "TiCl4 Barrier Process Engineering in Semiconductor Manufacturing" Coatings, 2016, 8 pages.
(Continued)

*Primary Examiner* — Cory W Eskridge
(74) *Attorney, Agent, or Firm* — Slater Matsil, LLP (57) ABSTRACT

Generally, the present disclosure provides example embodiments relating to conductive features, such as metal contacts, vias, lines, etc., and methods for forming those conductive features. In a method embodiment, a dielectric layer is formed on a semiconductor substrate. The semiconductor substrate has a source/drain region. An opening is formed through the dielectric layer to the source/drain region. A silicide region is formed on the source/drain region and a barrier layer is formed in the opening along sidewalls of the dielectric layer by a same Plasma-Enhance Chemical Vapor Deposition (PECVD) process.

20 Claims, 11 Drawing Sheets

Related U.S. Application Data continuation of application No. 17/036,734, filed on Sep. 29, 2020, now Pat. No. 11,232,945, which is a continuation of application No. 16/568,720, filed on Sep. 12, 2019, now Pat. No. 10,804,097, which is a division of application No. 15/860,354, filed on Jan. 2, 2018, now Pat. No. 10,714,334.

(60) Provisional application No. 62/591,526, filed on Nov. 28, 2017.

(51) Int. Cl.
    *H01L 21/762*      (2006.01)
    *H01L 21/768*      (2006.01)
    *H01L 23/532*      (2006.01)
    *H10D 84/01*      (2025.01)
    *H10D 84/03*      (2025.01)

(52) U.S. Cl.
    CPC .. *H01L 21/76802* (2013.01); *H01L 21/76843* (2013.01); *H01L 21/76889* (2013.01); *H01L 23/53266* (2013.01); *H10D 84/0184* (2025.01); *H10D 84/038* (2025.01); *H10D 84/013* (2025.01)

(56) References Cited

U.S. PATENT DOCUMENTS

| | | | |
|---|---|---|---|
| 6,174,805 B1 | 1/2001 | Urabe | |
| 7,060,577 B2 | 6/2006 | Lee et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2003/0236003 A1* | 12/2003 | Koo | H01L 21/76862 438/653 |
| 2004/0082168 A1 | 4/2004 | Lee et al. | |
| 2010/0227472 A1 | 9/2010 | Futase | |
| 2011/0303971 A1* | 12/2011 | Lee | H10D 30/69 257/324 |
| 2014/0106523 A1 | 4/2014 | Koldiaev et al. | |
| 2015/0054084 A1 | 2/2015 | Ekbote et al. | |
| 2017/0032972 A1 | 2/2017 | Tsai et al. | |

FOREIGN PATENT DOCUMENTS

| | | | |
|---|---|---|---|
| CN | 105453264 | A | 3/2016 |
| DE | 102015113184 | A | 2/2017 |
| JP | H0444224 | A | 2/1992 |
| JP | 2009529789 | A | 8/2009 |
| KR | 19990045603 | A | 6/1999 |
| KR | 20040003947 | A | 1/2004 |
| KR | 20090032963 | A | 4/2009 |
| TW | 201543688 | A | 11/2015 |
| TW | 201606937 | A | 2/2016 |
| TW | 201709517 | A | 3/2017 |
| WO | 9935675 | A1 | 7/1999 |

OTHER PUBLICATIONS

D. Munteanu et al., "The Influence of Nitrogen Content on the Properties of TiNx Thin Films" Journal of Optoelectronics and Advanced Materials, vol. 8, No. 2, Apr. 2006, p. 720-725.

* cited by examiner

CONDUCTIVE FEATURE FORMATION AND STRUCTURE

PRIORITY CLAIM AND CROSS-REFERENCE

This application is a continuation of U.S. patent application Ser. No. 17/577,726, filed on Jan. 18, 2022, entitled "Conductive Feature Formation and Structure," which is a continuation of U.S. patent application Ser. No. 17/036,734, filed on Sep. 29, 2020, entitled "Conductive Feature Formation and Structure," now U.S. Pat. No. 11,232,945 issued on Jan. 25, 2022, which is a continuation of U.S. patent application Ser. No. 16/568,720, filed on Sep. 12, 2019, entitled "Conductive Feature Formation and Structure," now U.S. Pat. No. 10,804,097, issued on Oct. 13, 2020, which is a divisional of U.S. patent application Ser. No. 15/860,354, filed on Jan. 2, 2018, entitled "Conductive Feature Formation and Structure," now U.S. Pat. No. 10,714,334 issued on Jul. 14, 2020, which claims the benefit of and priority to U.S. Provisional Patent Application No. 62/591,526, filed on Nov. 28, 2017, entitled "Conductive Feature Formation and Structure," which are incorporated herein by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to conductive features, such as metal contacts, vias, lines, etc., and methods for forming those conductive features. More specifically, in some examples, a barrier layer, and in some cases, a silicide region, for a conductive feature can be formed using a single process, such as a Plasma-Enhanced Chemical Vapor Deposition (PECVD) process. A PECVD process used to form a barrier layer in some embodiments can permit avoiding more complicated processes, such as implantation of an element into a metal layer and an anneal to form a barrier layer. Additionally, in some examples, a PECVD process forms a barrier layer in a high aspect ratio opening with a high conformality and a high coverage percentage.

Example embodiments described herein are described in the context of forming conductive features in Front End Of the Line (FEOL) processing for transistors. Implementations of some aspects of the present disclosure may be used in other processes and/or in other devices. For example, conductive features may be formed in FEOL processing to other devices, and/or may be formed in an intermetallization dielectric (IMD) in Back End Of the Line (BEOL) processing. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

Figure 1:
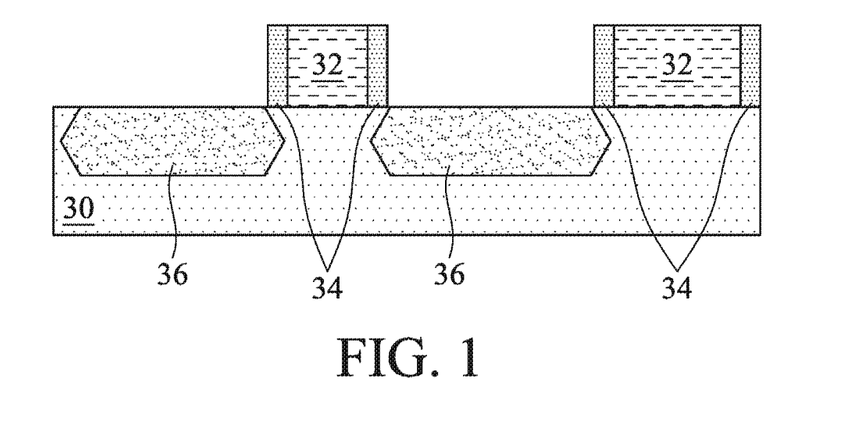
FIGS. 1 through 6 are cross-sectional views of respective intermediate structures during an example method for forming conductive features in accordance with some embodiments.

FIGS. 1 through 6 illustrate cross-sectional views of respective intermediate structures during an example method for forming conductive features in accordance with some embodiments. FIG. 7 is a flow chart of the example method for forming conductive features in accordance with some embodiments. FIG. 1 illustrates a semiconductor substrate 30 with at least portions of devices formed thereon.

The semiconductor substrate 30 may be or include a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, such as a silicon oxide layer, or the like. The insulator layer is provided on or is a substrate, typically a silicon or glass substrate. Other substrates, such as a multi-layered or gradient substrate may also be used. In some embodiments, the semiconductor material of the semiconductor substrate may include an elemental semiconductor such as silicon (Si) and germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof.

As illustrated in the figures and described herein, the devices are Field Effect Transistors (FETs), which may be planar FETs or Fin FETs (FinFETs). In other implementations, the devices can include Vertical Gate All Around (VGAA) FETs, Horizontal Gate All Around (HGAA) FETs, nanowire channel FETs, bipolar junction transistors (BJTs), diodes, capacitors, inductors, resistors, etc. In accordance with planar FETs and/or FinFETs, gate stacks 32 are formed on active areas of the semiconductor substrate 30. In planar FETs, the active areas can be or include a portion at the top surface of the semiconductor substrate 30 delineated by isolation regions. In FinFETs, the active areas can be or include three-dimensional fins protruding from between isolation regions on the semiconductor substrate 30.

The gate stacks 32 can be operational gate stacks like in a gate-first process or can be dummy gate stacks like in a replacement gate process. Each gate stack 32 can comprise a dielectric layer over the active area, a gate layer over the dielectric layer, and, in some instances, a mask layer over the gate layer. The dielectric layer, gate layer, and mask layer for the gate stacks 32 may be formed by sequentially forming or depositing the respective layers, and then patterning those layers into the gate stacks 32. For example, in a gate-first process or a replacement gate process, the dielectric layer may include or be silicon oxide, silicon nitride, the like, or multilayers thereof; the gate layer may include or be silicon (e.g., polysilicon) or another material; and the mask layer may include or be silicon nitride, silicon oxynitride, silicon carbon nitride, the like, or a combination thereof. In a gate-first process, for example, the dielectric layer (e.g., gate dielectric) may also or instead include or be a high-k dielectric material, such as having a k value greater than about 7.0, which may include a metal oxide or silicate of Hf, Al, Zr, La, Mg, Ba, Ti, Pb, multilayers thereof, or a combination thereof, and the gate layer (e.g., gate electrode) may also or instead include or be a metal-containing material such as TiN, TaN, TaC, Co, Ru, Al, multi-layers thereof, or a combination thereof. Processes for forming or depositing the dielectric layer, gate layer, and mask layer include thermal and/or chemical growth, Chemical Vapor Deposition (CVD), PECVD, Molecular-Beam Deposition (MBD), Atomic Layer Deposition (ALD), Physical Vapor Deposition (PVD), and other deposition techniques.

The layers for the gate stacks 32 may then be patterned to be the gate stacks 32, for example, using photolithography and one or more etch processes. For example, a photo resist can be formed on the mask layer (or gate layer, for example, if no mask layer is implemented), such as by using spin-on coating, and can be patterned by exposing the photo resist to light using an appropriate photomask. Exposed or unexposed portions of the photo resist may then be removed depending on whether a positive or negative resist is used. The pattern of the photo resist may then be transferred to the layers of the gate stacks 32, such as by using one or more suitable etch processes. The one or more etch processes may include a reactive ion etch (RIE), neutral beam etch (NBE), the like, or a combination thereof. The etch process may be anisotropic. Subsequently, the photo resist is removed in an ashing or wet strip processes, for example.

In some embodiments, after forming the gate stacks 32, lightly doped drain (LDD) regions (not specifically illustrated) may be formed in the active areas. For example, dopants may be implanted into the active areas using the gate stacks 32 as masks. Example dopants can include or be, for example, boron for a p-type device and phosphorus or arsenic for an n-type device, although other dopants may be used. The LDD regions may have a dopant concentration in a range from about $10^{15}$ cm$^{-3}$ to about $10^{17}$ cm$^{-3}$.

Gate spacers 34 are formed along sidewalls of the gate stacks 32 (e.g., sidewalls of the dielectric layer, gate layer, and mask layer) and over the active areas on the semiconductor substrate 30. The gate spacers 34 may be formed by conformally depositing one or more layers for the gate spacers 34 and anisotropically etching the one or more layers, for example. The one or more layers for the gate spacers 34 may include or be silicon nitride, silicon oxynitride, silicon carbon nitride, the like, multi-layers thereof, or a combination thereof, deposited by CVD, ALD, or another deposition technique. The etch process can include a RIE, NBE, or another etch process.

Source/drain regions 36 are formed in the active regions on opposing sides of a gate stack 32. In some examples, the source/drain regions 36 are formed by implanting dopants into the active areas using the gate stacks 32 and gate spacers 34 as masks. Hence, source/drain regions 36 can be formed by implantation on opposing sides of each gate stack 32.

In other examples, such as illustrated, the active areas may be recessed using the gate stacks 32 and gate spacers 34 as masks, and epitaxial source/drain regions 36 may be epitaxially grown in the recesses. The recessing can be by an etch process. The etch process can be isotropic or anisotropic, or further, may be selective with respect to one or more crystalline planes of the semiconductor substrate 30. Hence, the recesses can have various cross-sectional profiles based on the etch process implemented. The etch process may be a dry etch, such as a RIE, NBE, or the like, or a wet etch, such as using tetramethyalammonium hydroxide (TMAH), ammonium hydroxide (NH$_4$OH), or another etchant. The epitaxy source/drain regions 36 may include or be silicon germanium ($Si_xGe_{1-x}$, where x can be between approximately 0 and 100), silicon carbide, silicon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 36 may be formed in the recesses by epitaxially growing a material in the recesses, such as by metal-organic CVD (MOCVD), molecular beam epitaxy (MBE), liquid phase epitaxy (LPE), vapor phase epitaxy (VPE), selective epitaxial growth (SEG), the like, or a combination thereof. Epitaxial source/drain regions 36 may be raised in relation to the active area. The epitaxial source/drain regions 36 may be doped by in situ doping during the epitaxial growth and/or by implantation after the epitaxial growth. Hence, source/drain regions 36 can be formed by epitaxial growth, and possibly with implantation, on opposing sides of each gate stack 32.

Example dopants for source/drain regions 36 (e.g., by in situ doping or implantation) can include or be, for example, boron for a p-type device and phosphorus or arsenic for an n-type device, although other dopants may be used. The source/drain regions 36 may have a dopant concentration in a range from about $10^{19}$ cm$^{-3}$ to about $10^{21}$ cm$^{-3}$.

Figure 2:
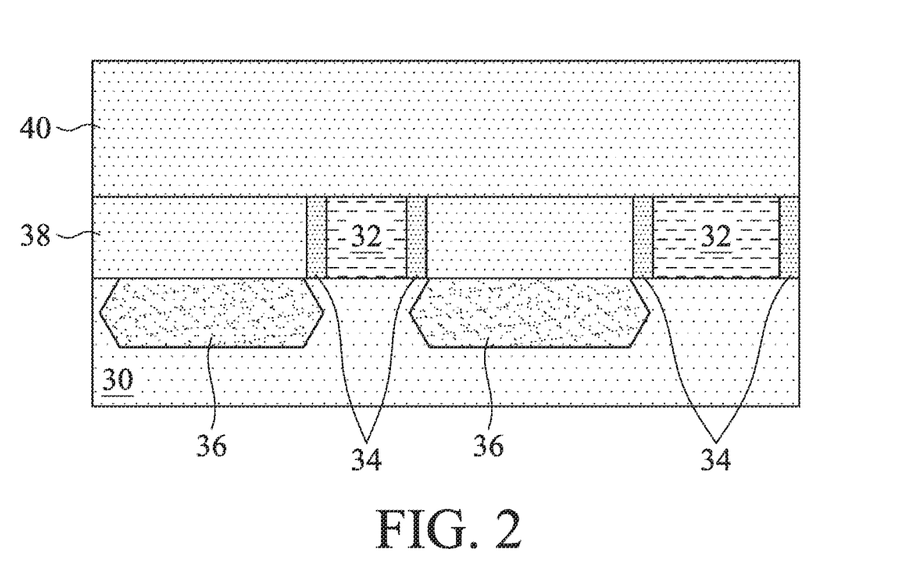

FIG. 2 illustrates the formation of one or more dielectric layers, e.g., a first interlayer dielectric (ILD) 38 and a second ILD 40, as in operation 102 of FIG. 7. The first ILD 38 and second ILD 40 may each include an etch stop layer (ESL) and a principal dielectric layer such as a low-k dielectric layer, for example. Generally, an etch stop layer can provide a mechanism to stop an etch process when forming, e.g., contacts or vias. An etch stop layer may be formed of a dielectric material having a different etch selectivity from adjacent layers, for example, the principal dielectric layer of the ILD.

The first ILD 38 is deposited over the active areas, gate stacks 32, and gate spacers 34. For example, the etch stop layer may be conformally deposited over the active areas, gate stacks 32, and gate spacers 34. The etch stop layer may comprise or be silicon nitride, silicon carbon nitride, silicon carbon oxide, carbon nitride, the like, or a combination thereof, and may be deposited by CVD, PECVD, ALD, or another deposition technique. Then, for example, the principal dielectric layer is deposited over the etch stop layer. The principal dielectric layer may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The principal dielectric layer may be deposited by spin-on, CVD, Flowable CVD (FCVD), PECVD, PVD, or another deposition technique.

The first ILD 38 can be planarized after being deposited. A planarization process, such as a Chemical Mechanical Polish (CMP), may be performed to planarize the first ILD 38. In some processes, such as in a gate-first process, the top surface of the first ILD 38 may be above top surfaces of the gate stacks 32. In other processes, such as a replacement gate process, the top surface of the first ILD 38 is planarized to be coplanar with top surfaces of the gate stacks 32 to thereby expose the gate stacks 32 through the first ILD 38. In such process, the planarization may remove the mask layer of the gate stacks 32 (and, in some instances, upper portions of the gate spacers 34), and accordingly, top surfaces of the gate layer of the gate stacks 32 are exposed through the first ILD 38.

In a replacement gate process, the gate stacks 32 exposed through the first ILD 38 can be removed and replaced with other gate stacks 32. Once exposed through the first ILD 38, the gate layer and dielectric layer of the gate stacks 32 are removed, such as by one or more etch processes. The gate layer may be removed by an etch process selective to the gate layer, wherein the dielectric layer can act as an etch stop layer, and subsequently, the dielectric layer can be removed by a different etch process selective to the dielectric layer. The etch processes can be, for example, a RIE, NBE, a wet etch, or another etch process. Replacement gate stacks can be formed as the gate stacks 32 where the gate stacks 32 were removed. The replacement gate stacks 32 can each include one or more conformal layers and a gate electrode over the one or more conformal layers. The one or more conformal layers include a gate dielectric layer and may include one or more work-function tuning layers.

The gate dielectric layer can be conformally deposited where the gate stacks 32 were removed (e.g., on surfaces of the active areas and sidewalls of the gate spacers 34) and on the top surfaces of the first ILD 38 and gate spacers 34. The gate dielectric layer can be or include silicon oxide, silicon nitride, a high-k dielectric material, multilayers thereof, or other dielectric material. A high-k dielectric material may have a k value greater than about 7.0, and may include a metal oxide of or a metal silicate of Hf, Al, Zr, La, Mg, Ba, Ti, Pb, or a combination thereof. The gate dielectric layer can be deposited by ALD, PECVD, MBD, or another deposition technique.

Then, if implemented, a work-function tuning layer may be conformally deposited on the gate dielectric layer. The work-function tuning layer may include or be tantalum, tantalum nitride, titanium, titanium nitride, the like, or a combination thereof, and may be deposited by ALD, PECVD, MBD, or another deposition technique. Any additional work-function tuning layers may be sequentially deposited similar to the first work-function tuning layer.

A layer for the gate electrodes is formed over the one or more conformal layers. The layer for the gate electrodes can fill remaining regions where the gate stacks 32 were removed. The layer for the gate electrodes may be or comprise a metal-containing material such as Co, Ru, Al, W, Cu, multi-layers thereof, or a combination thereof. The layer for the gate electrodes can be deposited by ALD, PECVD, MBD, PVD, or another deposition technique.

Portions of the layer for the gate electrodes and the one or more conformal layers above the top surface of the first ILD 38 are removed. For example, a planarization process, like a CMP, may remove the portions of the layer for the gate electrodes and the one or more conformal layers above the top surface of the first ILD 38. The replacement gate stacks 32 comprising the gate electrodes and one or more conformal layers may therefore be formed.

The second ILD 40 is deposited over the first ILD 38. For example, the etch stop layer may be deposited over the first ILD 38. Then, for example, the principal dielectric layer is deposited over the etch stop layer. The etch stop layer and principal dielectric layer of the second ILD 40 can be or include the same or similar materials, and can be deposited using the same or similar techniques, as described above with respect to the etch stop layer and principal dielectric layer of the first ILD 38, respectively. The second ILD 40 can be planarized, such as by a CMP, after being deposited.

Figure 3:
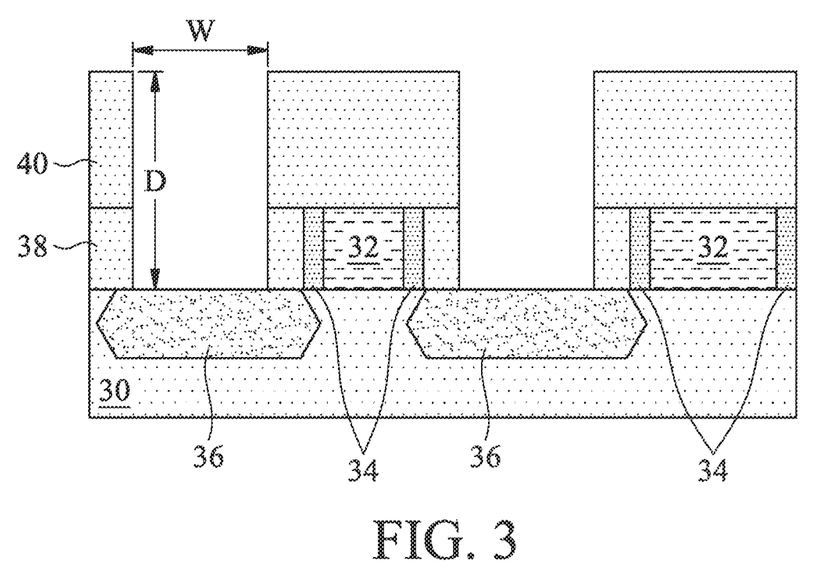

FIG. 3 illustrates the formation of openings 42 and 44 through the second ILD 40 and the first ILD 38 to respective source/drain regions 36, as in operation 104 of FIG. 7. Each of the openings 42 and 44 exposes a respective source/drain region 36. The openings 42 and 44 are therefore for forming respective conductive features to the source/drain regions 36. The openings 42 and 44 may be formed using, for example, appropriate photolithography and etch processes. In some examples, the openings 42 and 44 can each have a depth D in a range from about 10 nm to about 120 nm, such as about 65 nm, and a width W in a range from about 3 nm to about 80 nm, such as about 14 nm. An aspect ratio of the openings 42 and 44 (e.g., a ratio of the depth D to the width W) can be in a range from about 5 to about 25.

Figure 4:
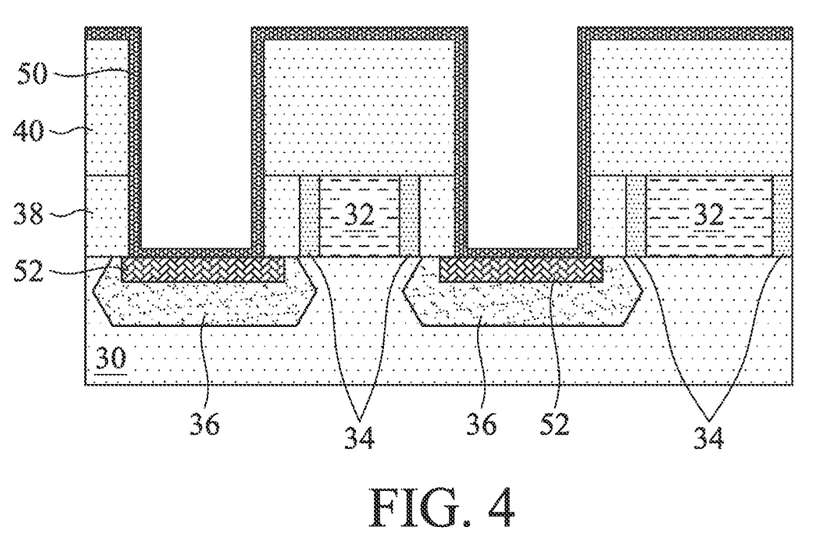

FIG. 4 illustrates the formation of a barrier layer 50 conformally in the openings 42 and 44, and the formation of silicide regions 52 on the source/drain regions 36, as in operation 106 of FIG. 7. The barrier layer 50 and silicide regions 52 may be formed by a single deposition process. For example, the barrier layer 50 and silicide regions 52 may be formed by a single PECVD process. In some examples, the barrier layer 50 is a titanium nitride layer including residual chlorine, and the silicide regions 52 are titanium silicide.

In some examples, a barrier layer 50 of titanium nitride with residual chlorine and silicide regions 52 of titanium silicide are formed using a single PECVD process. The PECVD process, in these examples, includes using a combination of gases of titanium tetrachloride (TiCl$_4$), hydrogen (H$_2$), ammonia (NH$_3$), and argon (Ar), and includes gaseous reactions and substrate surface reactions. The gaseous reactions can include a reaction as indicated in chemical equation (1) below.

$$TiCl_4 + H_2 + Ar^* \rightarrow \qquad \text{Eq. (1)}$$
$$TiCl_x + 2HCl + Ar \text{ (where } x \text{ is generally 2 or 3)}$$

As shown, the gaseous TiCl$_4$, H$_2$, and Ar* react to create, among other byproducts, titanium chloride (TiCl$_x$), which is a reactant of the surface reactions.

The substrate surface reactions can include reactions for silicidation on the source/drain regions 36 as indicated in chemical equation (2) below.

$$TiCl_x + 2Si + H_2 \rightarrow TiSi_2 + Cl_{x-residual} + 2HCl \qquad \text{Eq. (2)}$$

The titanium chloride (TiCl$_x$) byproduct of the gaseous reactions reacts with silicon (Si) in the source/drain regions 36 and the hydrogen (H$_2$) gas to form titanium silicide (TiSi$_2$) with residual chlorine. Hydrochloric acid (HCl) is a byproduct of the reaction that is removed by the flow of the gases in the PECVD process.

The substrate surface reactions can also include reactions for dielectric (e.g., SiO$_2$) sublimation and nitridation as indicated in chemical equations (3) and (4), respectively, below.

$$TiCl_x + H_2 \rightarrow Ti + 2HCl + Cl_{x-residual} \qquad \text{Eq. (3)}$$
$$2Ti + 2NH_3 + Ar^* \rightarrow 2TiN + 3H_2 + Ar \qquad \text{Eq. (4)}$$

The titanium chloride (TiCl$_x$) byproduct of the gaseous reactions reacts with the hydrogen (H$_2$) gas to deposit titanium (Ti) with residual chlorine on surfaces where the titanium chloride does not react with the surface, such as surfaces of a dielectric (e.g., SiO$_2$) like sidewalls of the openings 42 and 44 and top surface of the second ILD 40, and such as on a top surface of the silicide regions 52. The titanium (Ti) then reacts with the ammonia (NH$_3$) gas to form titanium nitride (TiN). The residual chlorine is therefore formed in the titanium nitride (TiN). Hydrogen (H$_2$) and hydrochloric acid (HCl) are byproducts of the reactions that are removed by the flow of the gases in the PECVD process.

In some examples, titanium (Ti) with residual chlorine deposited on various surfaces (e.g., the sidewalls of the openings 42 and 44) fully reacts with the ammonia (NH$_3$) to form the titanium nitride (TiN) without a film of titanium (Ti) being disposed between the surface(s) and the titanium nitride (TiN). In other examples, a film of titanium (Ti) with residual chlorine remains unreacted with nitrogen and is between the titanium nitride (TiN) and the surface on which the titanium is deposited (e.g., the sidewalls of the openings 42 and 44). This may occur by controlling when and/or at what flow rate ammonia gas is provided in the PECVD process.

Using the PECVD process as described, a barrier layer 50 of titanium nitride may be conformally formed with a high coverage percentage. For example, the barrier layer 50 may cover in a range from about 90 percent to 100 percent of the sidewalls and bottom surfaces of the openings 42 and 44, even when the openings 42 and 44 have a high aspect ratio, such as in a range from about 5 to about 25. Additionally, the barrier layer 50 can have a thickness along one or more sidewalls of the openings 42 and 44 that is in a range from about 20 Å to about 80 Å, and can have a thickness along bottom surfaces of the openings 42 and 44 that is in a range from about 20 Å to about 80 Å. The silicide regions 52 can extend a depth into the source/drain regions 36 in a range from about 3 Å to about 825 Å.

The barrier layer 50 formed using the PECVD process described above can also have good adhesion to the first ILD 38 and second ILD 40. For example, the initial deposition of titanium (Ti), according to chemical equation (3), on the sidewalls of the first ILD 38 and second ILD 40 in the openings 42 and 44 can permit good bonding with the sidewalls of the first ILD 38 and second ILD 40. The titanium can react with material of the sidewalls before undergoing nitridation as indicated in chemical equation (4).

The barrier layer 50 and silicide regions 52 can be formed on any number of different materials using the PECVD process described above. For example, the barrier layer 50 can be formed on any dielectric, such as an oxide like silicon dioxide, silicon oxynitride, PSG, BSG, BPSG, USG, etc, and a nitride such as silicon nitride. The silicide regions 52 can be formed on any silicon-containing semiconductor material, such as silicon (Si) (undoped or p-type or n-type doped), silicon germanium (SiGe), silicon phosphide (SiP), silicon arsenic (SiAs), silicon carbide (SiC), silicon germanium boride (SiGeB), etc.

Concentrations of different elements in the barrier layer 50 and silicide regions 52 can be controlled by using the PECVD process. For example, a concentration of titanium in the barrier layer 50 and/or silicide regions 52 can be controlled, such as by controlling a flow rate of titanium tetrachloride (TiCl$_4$) in the PECVD process relative to other gases. In some examples, the concentration of titanium in the barrier layer 50 is uniform and is in a range from about $10^{17}$ cm$^{-3}$ to about $10^{21}$ cm$^{-3}$, and titanium in the barrier layer 50 may form Ti$_x$N, where x is in a range from about 0.6 to about 3. The silicide regions 52 may also be titanium-rich silicide, such as including a composite of Ti$_x$Si, where x is in a range from about 1 to about 2. By controlling a concentration of titanium in the silicide regions 52, a resistivity of the silicide regions 52, and thereby a resistivity of a conductive feature formed as described subsequently, can be tuned, such as from 0 to about 200 µΩ(2-cm. Silicon can be consumed to form the silicide regions 52 at a rate in a range from about 1.0 nm to about 3.0 nm per 1 nm of titanium. Similarly, a concentration of nitrogen in the barrier layer 50 can be controlled, such as by controlling a flow rate of ammonia (NH$_3$) in the PECVD process relative to other gases. In some examples, the concentration of nitrogen in the barrier layer 50 is uniform and is in a range from about $10^{17}$ cm$^{-3}$ to about $10^{21}$ cm$^{-3}$, and nitrogen in the barrier layer 50 may form TiN$_x$, where x is in a range from about 0.4 to about 3. Further, a concentration of chlorine in the barrier layer 50 can be controlled, such as by controlling a flow rate of titanium tetrachloride (TiCl$_4$) in the PECVD process relative to other gases. In some examples, the concentration of chlorine in the barrier layer 50 is in a range from about 1016 cm$^{-3}$ to about 10$^{21}$ cm$^{-3}$.

The barrier layer 50 may further be doped with a dopant. The doping may be in situ during the PECVD process, such as by introducing an additional gas during the PECVD process, and/or may be by subsequent treatment, such as implantation. Example dopants can include fluorine (F), oxygen (O), nitrogen (N), chlorine (Cl), silicon (Si), carbon (C), arsenic (As), germanium (Ge), cobalt (Co), and other dopants. The dopants may be implemented, for example, to achieve a desired feature of the barrier layer 50, such as resistivity, adhesion, diffusion prevention, etc.

Although the barrier layer 50 may be subsequently implanted with nitrogen and/or chlorine, in accordance with some embodiments, the barrier layer 50 is formed by a PECVD process as titanium nitride with residual chlorine, as described above, without a subsequent ion implantation and/or anneal (such as a rapid thermal anneal (RTA)) steps to form the titanium nitride. The PECVD process described above can therefore simplify the formation of a titanium nitride barrier layer.

After the barrier layer 50 and silicide regions 52 are formed, the barrier layer 50 may be pulled back (e.g., thinned). An etch process may be performed to pull back the barrier layer 50. The etch process may be selective to the material of the barrier layer 50 and may be isotropic. After the etch process, the barrier layer 50 can have a thickness along sidewalls of the openings 42 and 44 that is in a range from about 0.3 Å to about 30 Å, and can have a thickness along bottom surfaces of the openings 42 and 44 that is in a range from about 0.3 Å to about 30 Å. Pulling back the barrier layer 50 can increase an area of a conductive material 60 (e.g., to be subsequently deposited in forming a conductive feature) to which another conductive feature may contact.

Figure 5:
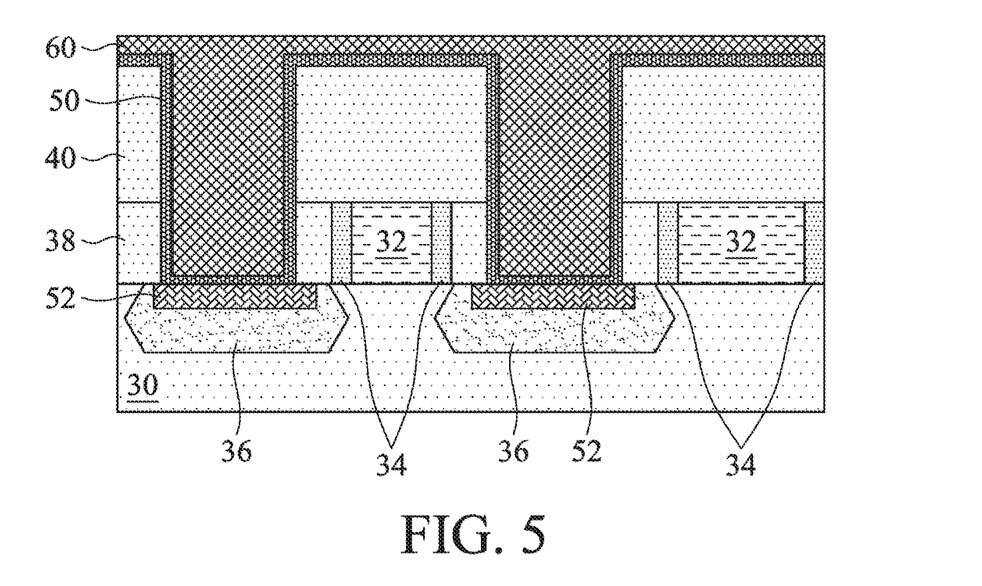

FIG. 5 illustrates the formation of conductive material 60 in the openings 42 and 44 and on the barrier layer 50 and silicide regions 52, as in operation 108 of FIG. 7. The conductive material 60 may be or comprise a metal, such as cobalt, tungsten, copper, ruthenium, alloys thereof, the like, or a combination thereof, and may be deposited by CVD, ALD, PVD, or another deposition technique.

Figure 6:
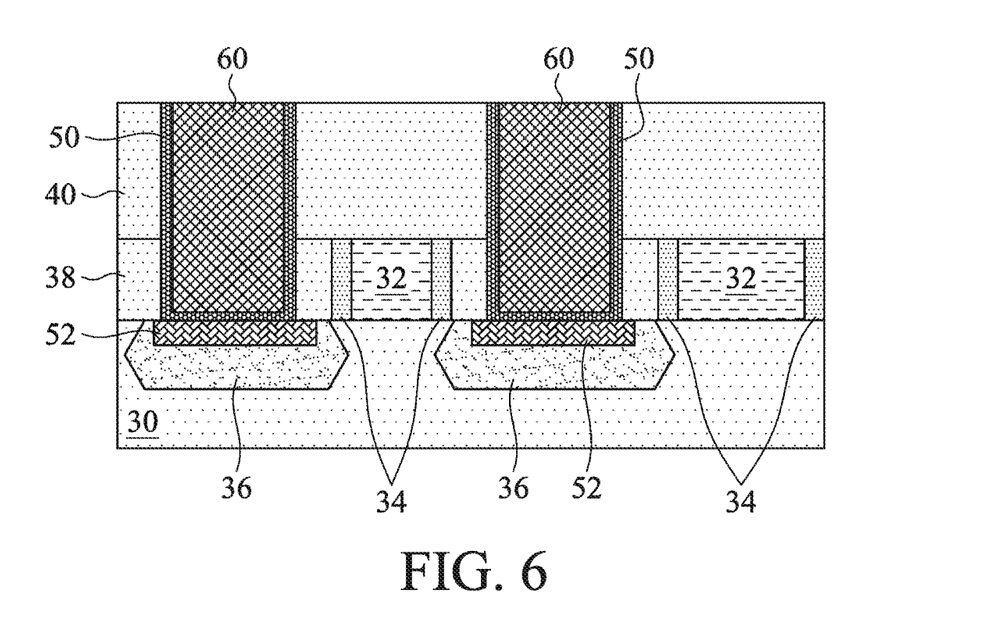
Figure 7:
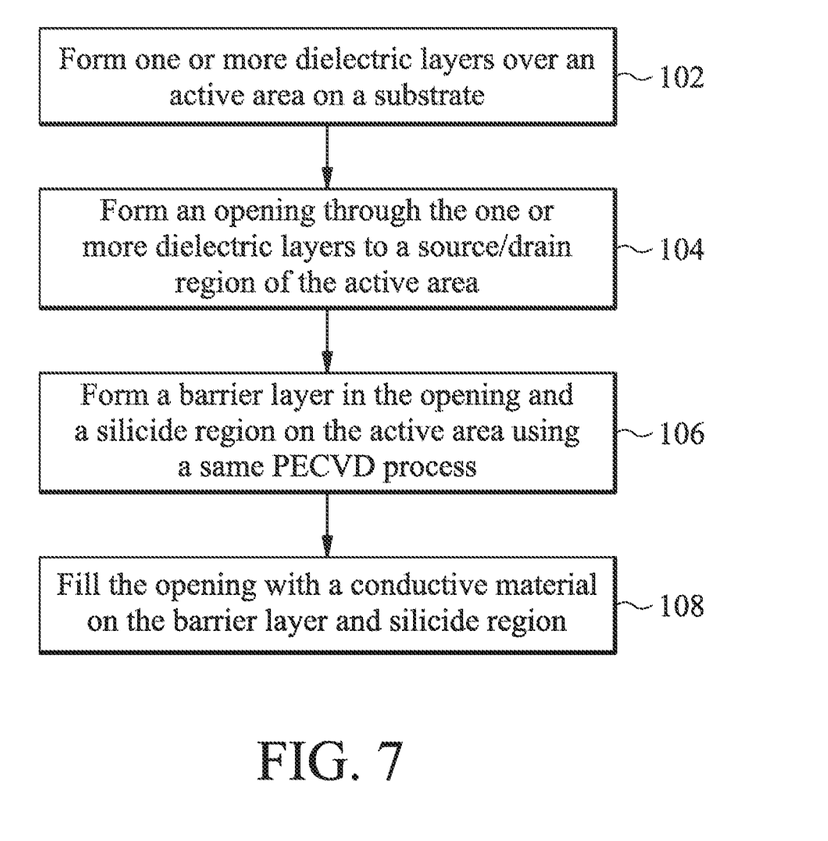
FIG. 7 is a flow chart of an example method for forming conductive features in accordance with some embodiments.
Figure 8A:
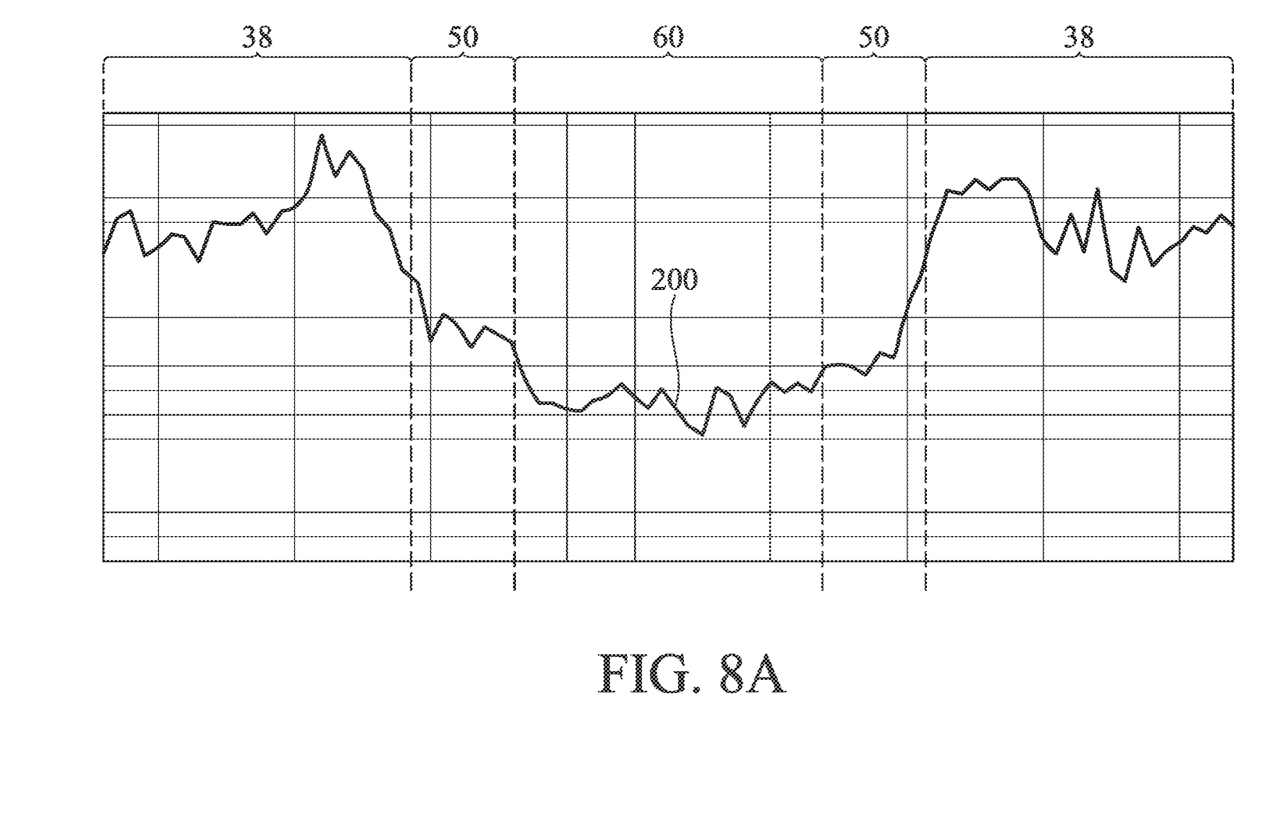
FIGS. 8A through 8F are energy-dispersive X-ray (EDX) analyses of a cross-section of an example conductive feature in accordance with some embodiments.
Figure 8B:
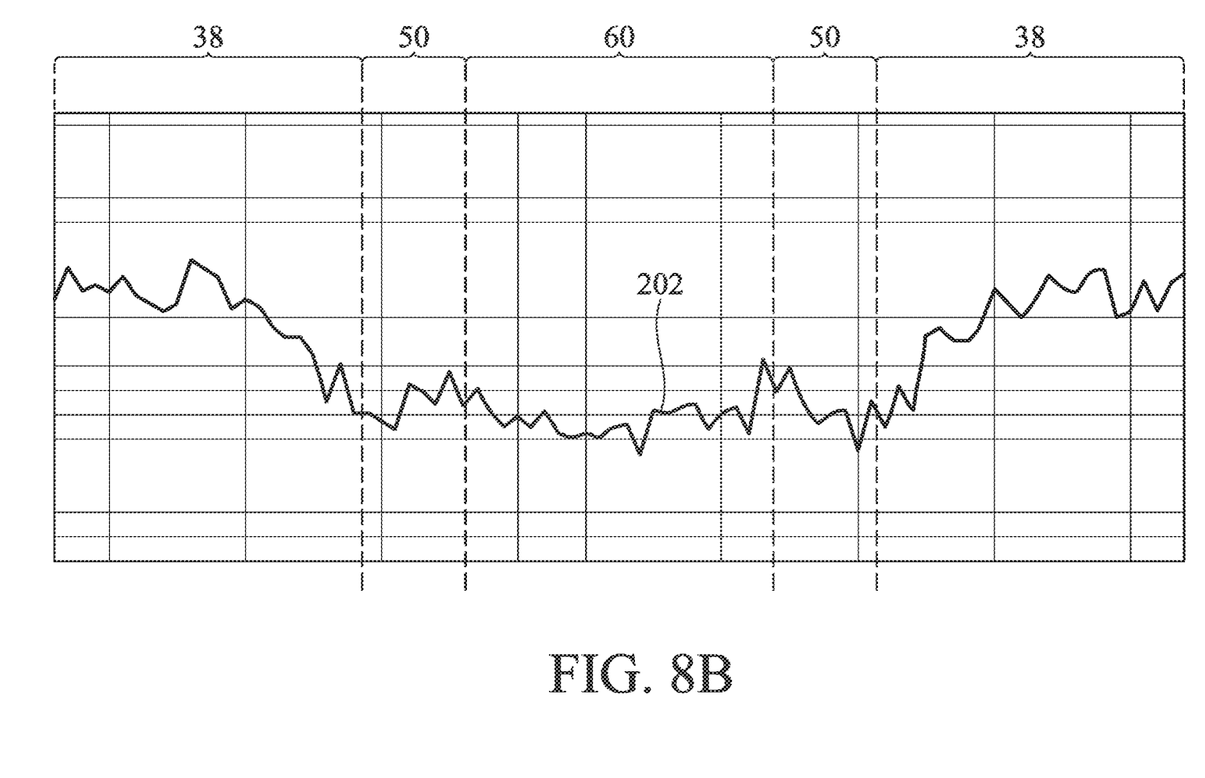
Figure 8C:
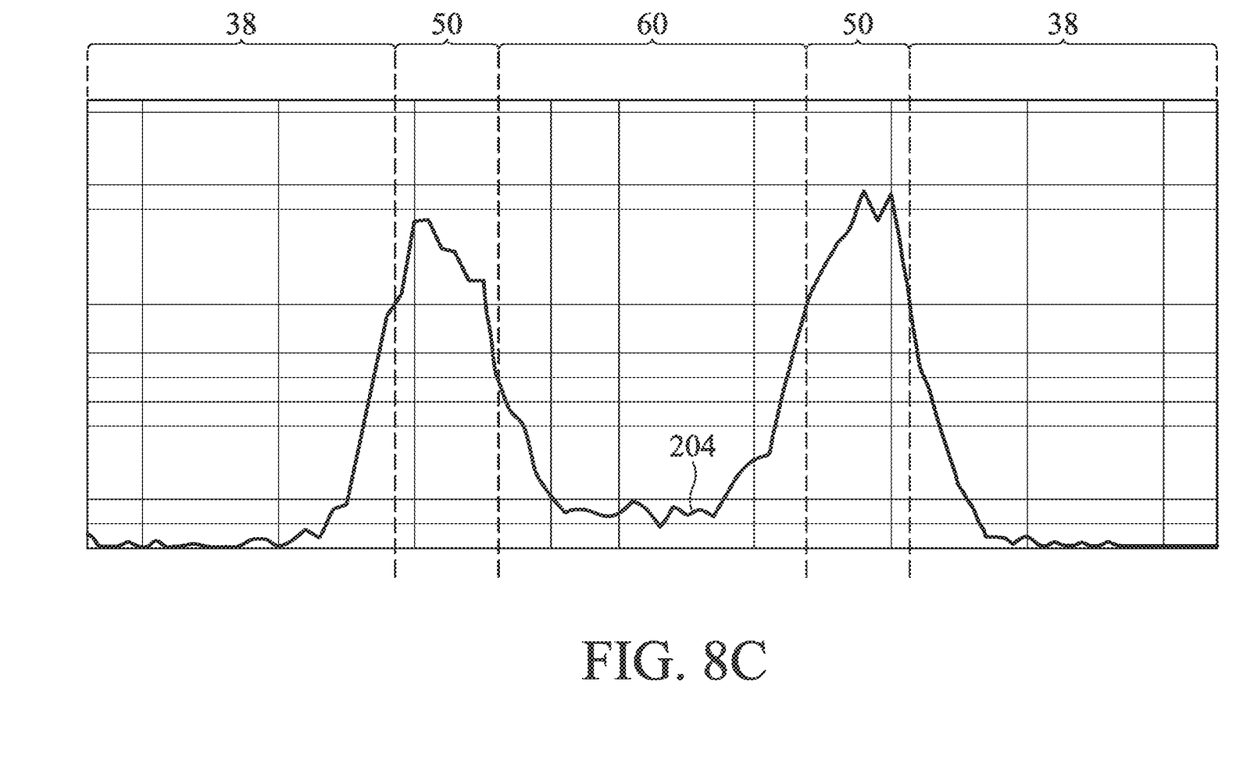
Figure 8D:
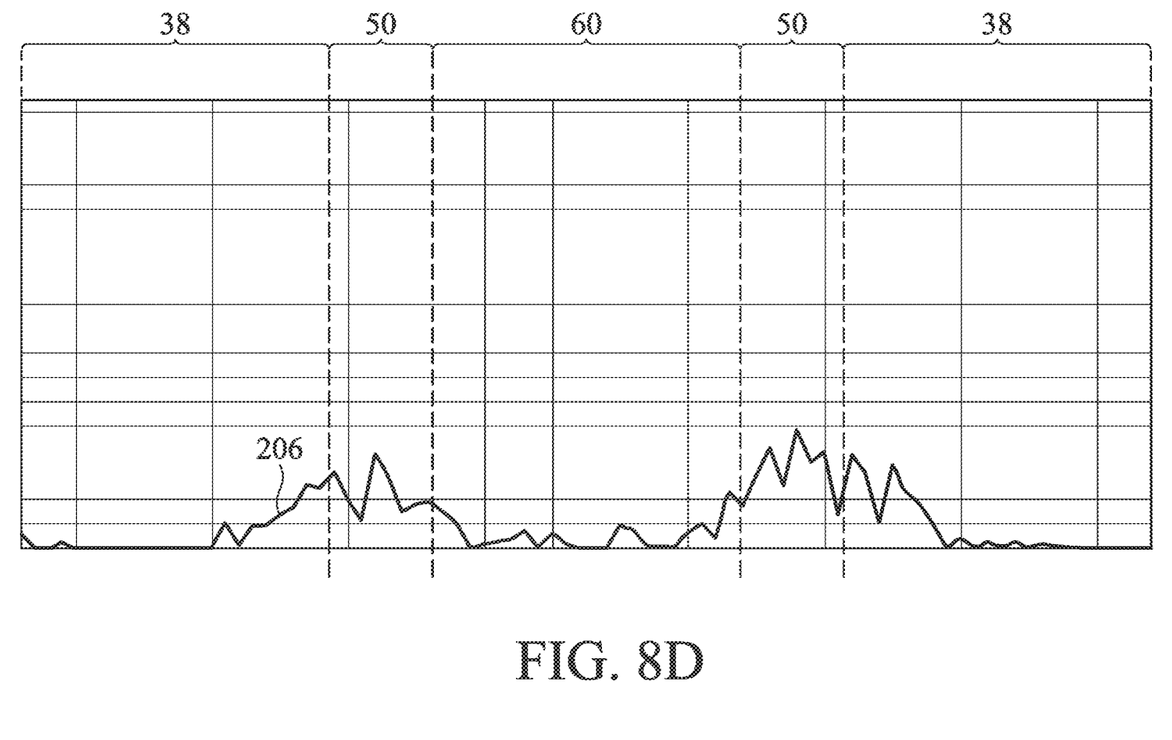
Figure 8E:
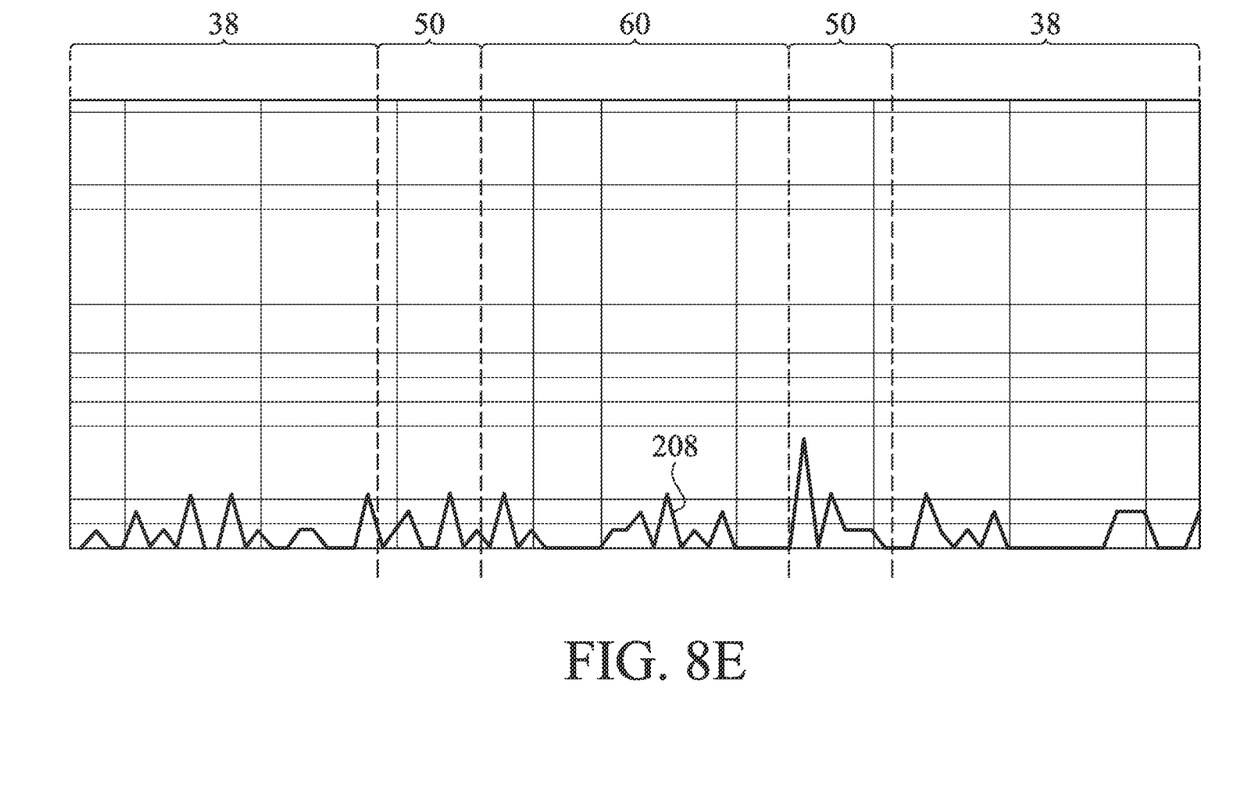
Figure 8F:
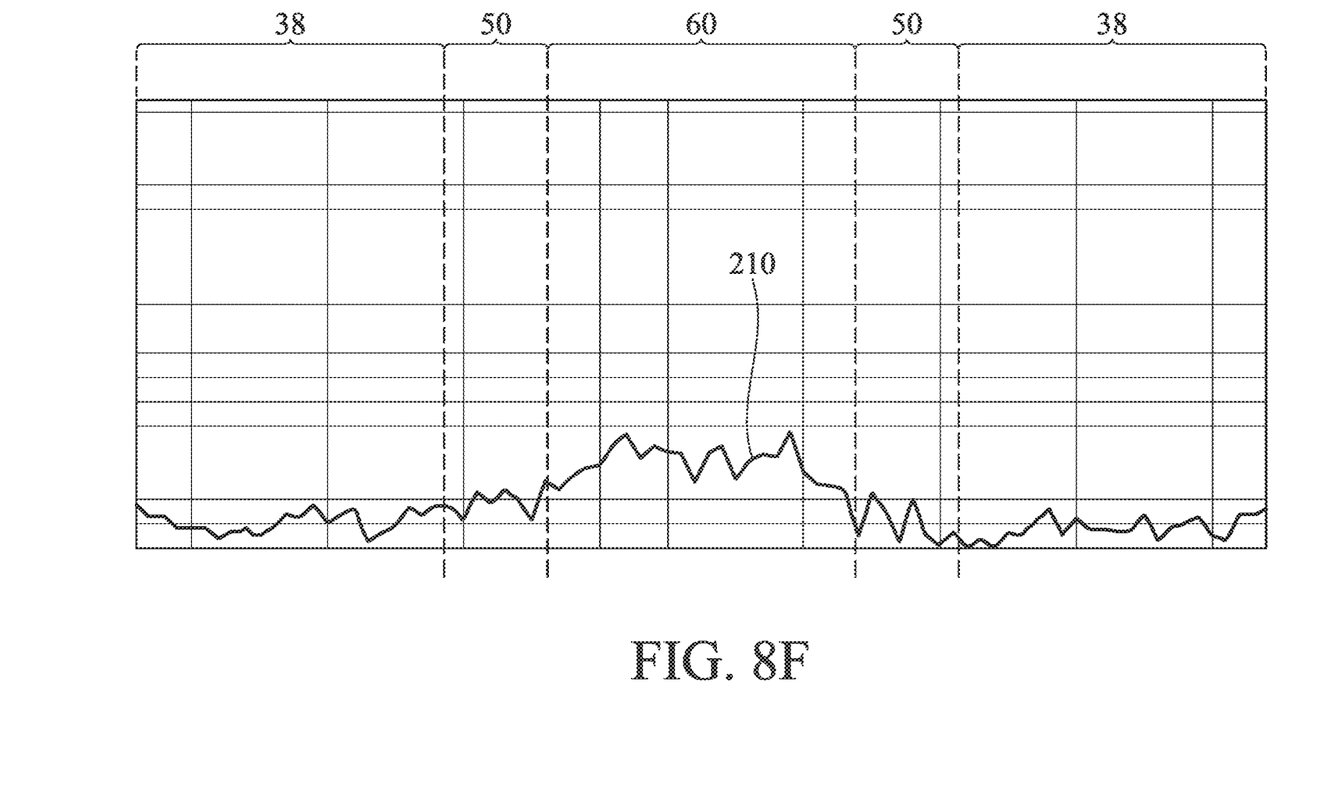

FIG. 6 illustrates the removal of excess conductive material 60 and barrier layer 50 above the top surface of the second ILD 40. After the conductive material 60 is deposited, excess conductive material 60 and barrier layer 50 over the top surface of the second ILD 40 may be removed by using a planarization process, such as a CMP, for example. This forms conductive features comprising the conductive material 60, barrier layer 50, and silicide regions 52 in the openings 42 and 44. Top surfaces of the conductive features and second ILD 40 may be coplanar. Accordingly, conductive features including the conductive material 60, barrier layer 50, and silicide regions 52 may be formed to corresponding source/drain regions 36.

As shown by the preceding, aspects of some embodiments can be applied to Front End Of the Line (FEOL) processes. Conductive features, including the processes by which the conductive features were formed, can implement aspects of various embodiments in FEOL. Other conductive features formed in FEOL or Middle End Of the Line (MEOL) processes may similarly incorporate aspects according to some embodiments. Similarly, conductive features, such as vias and conductive lines, formed in Back End Of the Line (BEOL) processes can implement aspects according to some embodiments. For example, barrier layers may be formed for vias and/or conductive lines in BEOL processes, such as without a silicide region being formed. Some embodiments can be implemented in, for example, resistive random-access memory (RRAM), magnetoresistive random-access memory (MRAM), or any other complementary metal-oxide-semiconductor (CMOS) design. Further, some embodiments may be implemented at various technology nodes, such as 5 nm, 3 nm, and other nodes.

FIGS. 8A through 8F are energy-dispersive X-ray (EDX) analyses of a cross-section of an example conductive feature in accordance with some embodiments. The conductive feature includes a barrier layer 50 that is formed by the PECVD process described above, where the barrier layer 50 includes titanium nitride with residual chlorine. The EDX analysis of FIG. 8A-8F indicates the presence of the first ILD 38, the barrier layer 50, and conductive material 60 in the cross-section. The EDX analysis shows respective concentrations of silicon 200, oxygen 202, titanium 204, nitrogen 206, chlorine 208, and carbon 210. As shown in this EDX analysis, residual chlorine 208 is present in the barrier layer 50.

Figure 9:
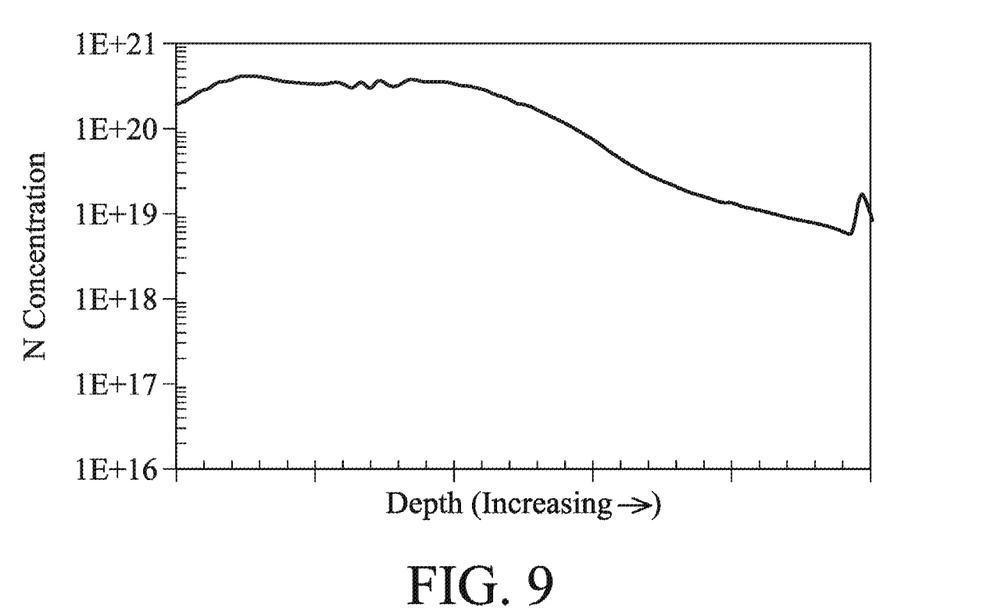
FIG. 9 is a secondary ion mass spectrometry (SIMS) analysis of a concentration of nitrogen in an example barrier layer in accordance with some embodiments.
Figure 10:
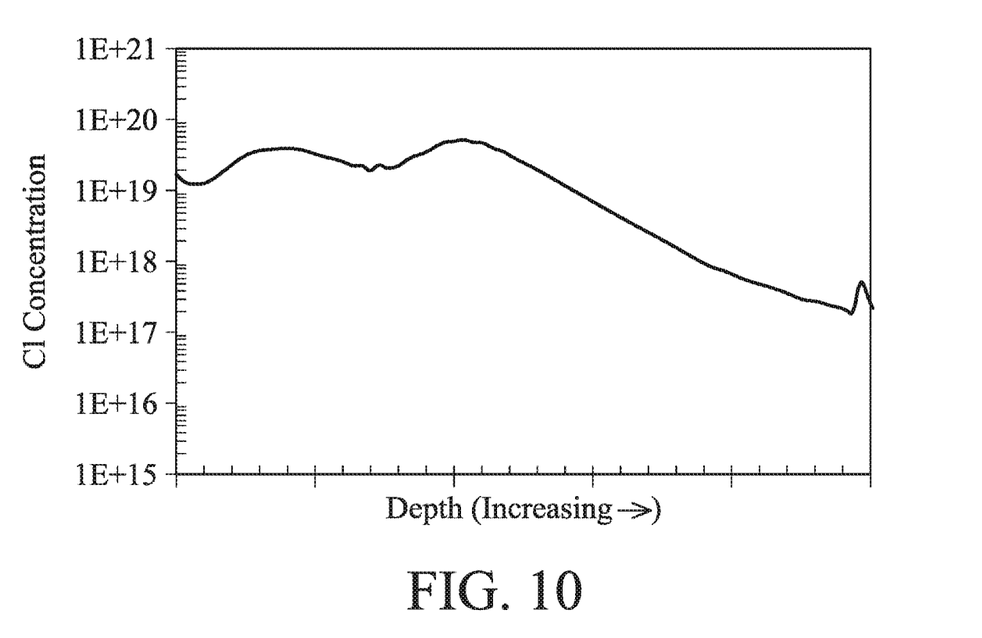
FIG. 10 is a SIMS analysis of a concentration of chlorine in an example barrier layer in accordance with some embodiments.

FIGS. 9 and 10 are secondary ion mass spectrometry (SIMS) analyses of an example barrier layer 50 in accordance with some embodiments. FIGS. 9 and 10 show concentrations of nitrogen and chlorine, respectively, as a function of depth in an opening in which the barrier layer 50 is formed. In some examples, a concentration of the chlorine can be varied and/or controlled to adjust a resistance of a conductive feature (e.g., a contact resistance). The range of the depth in FIGS. 9 and 10 can be from 20 nm to 45 nm, for example. As shown in FIG. 9, the concentration of nitrogen in the barrier layer 50 can be substantially uniform, which may be more uniform than previous techniques to form other barrier layers.

Some embodiments can achieve advantages. Generally, barrier layers are used in conductive features to mitigate against diffusion of conductive material into surrounding components, such as an ILD. Diffusion of conductive material from the conductive features can increase the resistance of the conductive features, and therefore, barrier layers can mitigate against such an increase in resistance. Hence, resistance-capacitance (RC) delays in an integrated circuit formed using the conductive features with the barrier layers can be decreased. Additionally, barrier layers can be used as buffer layers for subsequent deposition of conductive material (e.g., cobalt) on the barrier layers in forming the conductive features. Forming a barrier layer by a single process, such as a PECVD process as described above, can obviate using more complicated processes that could be used to form a barrier layer, such as depositing a metal layer, implanting an element in the metal layer, and annealing the implanted metal layer to form the barrier layer. Further, using the PECVD process as described above and in some embodiments can achieve a highly conformal barrier layer with good step coverage, even in a high aspect ratio opening, and can achieve a high coverage percentage. Even further, in some applications, a conductive feature formed according to some embodiments can be tuned according to design specifications, such as tuning a contact resistance to a source/drain region by controlling the concentrations of titanium, nitrogen, and/or chlorine in the barrier layer and/or silicide regions that are formed.

An embodiment is a method of manufacturing a conductive structure. A dielectric layer is formed on a semiconductor substrate. The semiconductor substrate has a source/drain region. An opening is formed through the dielectric layer to the source/drain region. A silicide region is formed on the source/drain region and a barrier layer is formed in the opening along sidewalls of the dielectric layer by a same Plasma-Enhance Chemical Vapor Deposition (PECVD) process.

Another embodiment is a method of manufacturing a conductive structure. A barrier layer of a conductive feature is formed over a semiconductor substrate by a Plasma-Enhance Chemical Vapor Deposition (PECVD) process. The PECVD process includes reacting, in a gaseous reaction, titanium tetrachloride ($TiCl_4$) and hydrogen ($H_2$) to produce titanium chloride ($TiCl_x$); reacting, in a first surface reaction, at least some of the titanium chloride ($TiCl_x$) with hydrogen ($H_2$) to produce titanium (Ti); and reacting, in a second surface reaction, at least some of the titanium (Ti) with ammonia ($NH_3$) to produce titanium nitride ($Ti_xN_y$). The barrier layer comprises the titanium nitride ($Ti_xN_y$).

A further embodiment is a structure. The structure includes a substrate, a dielectric layer, and a conductive feature. The substrate comprises an active area, and the active area comprises a source/drain region. The dielectric layer is over the substrate. The dielectric layer has a sidewall extending from a top surface of the dielectric layer to the source/drain region. The conductive feature contacts the source/drain region. The conductive feature includes a silicide region, a barrier layer, and a conductive material. The silicide region is on the source/drain region at the sidewall of the dielectric layer. The barrier layer is along the sidewall of the dielectric layer. The barrier layer includes chlorine. The conductive material is on the barrier layer and is above the silicide region. The barrier layer is disposed between the conductive material and the sidewall of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a source/drain region adjacent to a gate stack; and
   forming a silicide region simultaneously with forming a barrier layer directly over the source/drain region, the forming the silicide region and the forming the barrier layer being done with a single combination of chemicals flowed at a same time.

2. The method of claim 1, wherein the single combination of chemicals comprises titanium tetrachloride, hydrogen, ammonia, and argon.

3. The method of claim 2, wherein the forming the barrier layer comprises:
   depositing titanium; and
   reacting the titanium with the ammonia to form titanium nitride.

4. The method of claim 1, wherein the forming the barrier layer forms the barrier layer to have a concentration of chlorine in a range from about $1016$ $cm^{-3}$ to about $10^{21}$ $cm^{-3}$.

5. The method of claim 1, wherein the forming the barrier layer forms the barrier layer to have a uniform concentration of titanium.

6. The method of claim 1, wherein the forming the barrier layer forms the barrier layer to have a concentration of titanium in a range from about $10^{17}$ $cm^{-3}$ to about $10^{21}$ $cm^{-3}$.

7. The method of claim 1, wherein the forming the silicide region simultaneously with the forming the barrier layer is performed with a single PECVD process.

8. A method of manufacturing a semiconductor device, the method comprising:
   forming a gate stack over a substrate;
   forming a first source/drain region and a second source/drain region on opposite sides of the gate stack; and
   forming contacts to the first source/drain region and the second source/drain region, the forming the contacts comprising:
      exposing the first source/drain region and the second source/drain region; and
      depositing a barrier layer directly over the first source/drain region and the second source/drain region with a first set of chemicals, the first set of chemicals being introduced simultaneously with each other, wherein the first set of chemicals will also react with a material of the first source/drain region to form a silicide material.

9. The method of claim 8, wherein the depositing the barrier layer deposits a layer of titanium.

10. The method of claim 9, wherein the depositing the barrier layer further comprises transforming a portion of the titanium to titanium nitride.

11. The method of claim 10, wherein the transforming the portion of the titanium transforms all of the titanium.

12. The method of claim 10, wherein after the transforming the barrier layer comprises a layer of titanium covered by a layer of titanium nitride.

13. The method of claim 8, wherein after the depositing the barrier layer the barrier layer has a first thickness in a range from about 20 Å to about 80 Å.

14. The method of claim 8, wherein after the depositing the barrier layer the barrier layer has a second thickness adjacent to the silicide material, the second thickness in a range from about 20 Å to about 80 Å.

15. A method of manufacturing a semiconductor device, the method comprising:
   preparing a first precursor;
   preparing a second precursor; and
   simultaneously flowing the first precursor and the second precursor over a semiconductor substrate, wherein the first precursor and the second precursor work together to form a barrier layer on a dielectric material and a silicide on a source/drain region adjacent to a gate stack.

16. The method of claim 15, wherein after the simultaneously flowing the silicide extends a depth into the source/drain region in a range from about 3 Å to about 825 Å.

17. The method of claim 15, wherein the barrier layer is formed within an opening, the opening having an aspect ratio of between about 5 to about 25.

18. The method of claim 17, wherein the barrier layer covers greater than about 90 percent of the sidewalls of the opening.

19. The method of claim 15, wherein the silicide is a titanium rich silicide.

20. The method of claim 15, wherein after the simultaneously flowing the barrier layer has a concentration of titanium in a range from about $10^{17}$ cm$^{-3}$ to about $10^{21}$ cm$^{-3}$.

* * * * *